United States Patent
Engelhardt et al.

(10) Patent No.: US 9,800,042 B2
(45) Date of Patent: Oct. 24, 2017

(54) ELECTRICAL LOAD CONTROLLER WITH FAULT DETECTION

(71) Applicant: DELPHI TECHNOLOGIES, INC., Troy, MI (US)

(72) Inventors: Marc R. Engelhardt, Kokomo, IN (US); Kevin M. Gertiser, Carmel, IN (US); Vijayakumaran Nair Balakrishnan Nair, Singapore (SG); Peter A. Laubenstein, Sharpsville, IN (US)

(73) Assignee: DELPHI TECHNOLOGIES, INC., Troy, MI (US)

( * ) Notice: Subject to any disclaimer, the term of this patent is extended or adjusted under 35 U.S.C. 154(b) by 335 days.

(21) Appl. No.: 14/623,036

(22) Filed: Feb. 16, 2015

(65) Prior Publication Data

US 2016/0238652 A1    Aug. 18, 2016

(51) Int. Cl.
*H02H 3/20* (2006.01)
*H02H 1/00* (2006.01)
*G01R 31/02* (2006.01)

(52) U.S. Cl.
CPC ......... *H02H 1/0007* (2013.01); *G01R 31/024* (2013.01)

(58) Field of Classification Search
CPC ................................. H02H 3/20; H02H 3/207
USPC .................................................. 361/86, 91.1
See application file for complete search history.

(56) References Cited

U.S. PATENT DOCUMENTS

| | | | |
|---|---|---|---|
| 6,759,851 B2 | 7/2004 | Hazelton | |
| 2013/0083576 A1 | 4/2013 | Gan et al. | |
| 2013/0314836 A1* | 11/2013 | Christie | H03K 17/0822 361/95 |
| 2014/0049866 A1 | 2/2014 | Reiter et al. | |

FOREIGN PATENT DOCUMENTS

JP    2013 118777 A    6/2013

* cited by examiner

*Primary Examiner* — Dharti Patel
(74) *Attorney, Agent, or Firm* — Lawrence D. Hazelton

(57) ABSTRACT

A controller configured to detect fault conditions in a circuit that operates an electrical-load includes a gate-driver and a voltage-detector. The gate-driver is configured to control a gate-current to a switching-device. The gate-current is controlled such that the switching-device is operated in a linear-state when the switching-device transitions from an on-state to an off-state. The voltage-detector is configured to determine a voltage-drop across the switching-device. The controller is configured to indicate a no-fault condition when the voltage-drop is greater than a voltage-threshold for more time than a no-fault interval after the switching device is operated from the on-state to the linear-state.

3 Claims, 3 Drawing Sheets

ELECTRICAL LOAD CONTROLLER WITH FAULT DETECTION

TECHNICAL FIELD OF INVENTION

This disclosure generally relates to a controller configured to detect faults in an electrical-load and/or connections thereto, and more particularly relates to a controller that indicates a no-fault condition when the voltage-drop across a switching-device is greater than a voltage-threshold for more time than a no-fault interval after the switching device is operated from the on-state to the linear-state.

BACKGROUND OF INVENTION

It is known that add a sense resistor may be used to monitor current through an electrical-load by monitoring the voltage across the sense resistor, and detect fault conditions based on the current measured. In the case of an open-circuit (OC) fault or short-to-ground (STG) fault condition, nearly zero current will flow through a switching-device that controls the electrical-load during the on-state of the switching-device. Undesirably, a current monitoring circuit is required along with a current sensing device (e.g. the sense resistor). Furthermore, current monitoring circuits for detection of an open load condition that utilize external sense elements and signal amplifiers (such as a low value sense resistor) are expensive and consume valuable printed circuit board space. Also undesirably, detecting an OC fault while the switching-device is in an on-state typically requires system level (behavioral) diagnostics, information that is typically not communicated to a controller configured to detect fault conditions in a circuit that operates an electrical-load.

Integrated drain-to-source voltage (VDS) sensing methods of external field effect transistor (FETs) are typically not effective when the mathematical product of the on-state current (drain current ID) and on-resistance (Rdson) of the FET (i.e. the switching-device) is relatively low in magnitude. The drain current flowing through a typical external FET fails to develop a sufficient voltage from drain-to-source to enable reliable detection. Integrated Sense-FETs are expensive and are also relatively insensitive with respect to their ability to differentiate operating current from an open circuit. Alternative high "ON-Resistance" solutions have undesirably high static power dissipation.

SUMMARY OF THE INVENTION

In accordance with one embodiment, a controller configured to detect fault conditions in a circuit that operates an electrical-load is provided. The controller includes a gate-driver and a voltage-detector. The gate-driver is configured to control a gate-current to a switching-device. The gate-current is controlled such that the switching-device is operated in a linear-state when the switching-device transitions from an on-state to an off-state. The voltage-detector is configured to determine a voltage-drop across the switching-device. The controller is configured to indicate a no-fault condition when the voltage-drop is greater than a voltage-threshold for more time than a no-fault interval after the switching device is operated from the on-state to the linear-state.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Described herein is a circuit for operating electrical-loads (i.e. electrical devices) that is also able to detect short-to-ground (STG) and open-circuit (OC) conditions without disrupting the operation of the electrical-load.

Figure 1:
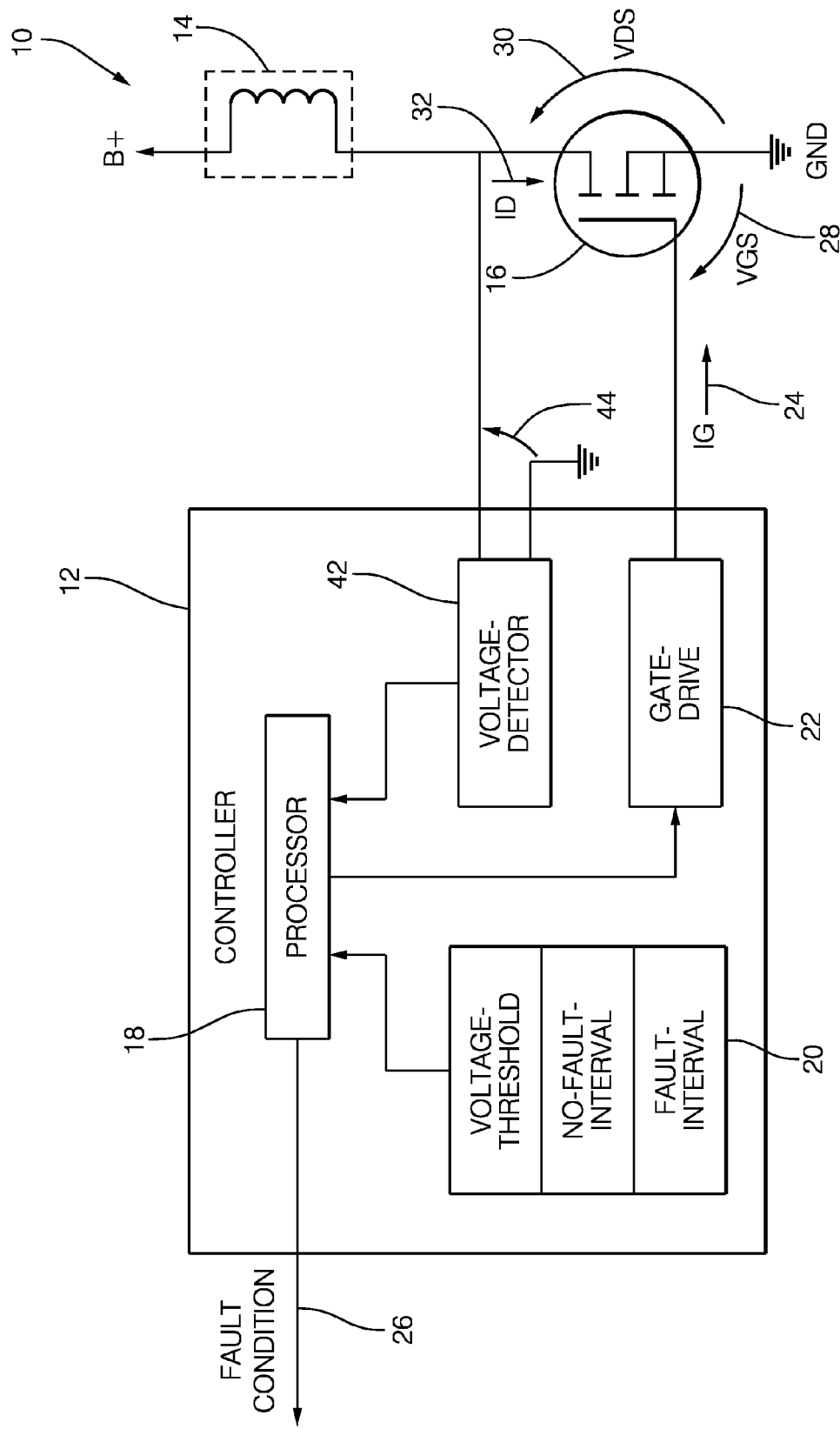
FIG. 1 is a schematic of a circuit that operates an electrical-load in accordance with one embodiment.

FIG. 1 illustrates a non-limiting example of a circuit 10 that includes a controller 12 configured to detect fault conditions in the circuit 10. In general, the circuit 10 operates an electrical-load 14 that is part of or is electrically coupled to the circuit 10. By way of example and not limitation, the electrical-load may be a device in a vehicle (e.g. automobile) such as a fuel pump, fan, solenoid, electric motor, or other electro-mechanical device that draws some amount of current (e.g. >50 milli-Amperes). Such devices may preferably be controlled via the operation of a metal-oxide-semiconductor-field-effect-transistor (MOSFET), insulated-gate-bipolar-transistor (IGBT), or other similar device, hereafter the switching-device 16.

The controller 12 may include a processor 18 such as a microprocessor or other control circuitry such as analog and/or digital control circuitry including an application specific integrated circuit (ASIC) for processing data, as should be evident to those in the art. While the controller 12 is illustrated as a single entity, it is contemplated that the controller 12 may be formed of many discrete parts, which may be interconnected by way of one or more printed circuit boards. The controller 12 may include memory 20, including non-volatile memory, such as electrically erasable programmable read-only memory (EEPROM) for storing one or more routines, thresholds and captured data. The one or more routines may be executed by the processor 18 to perform steps for determining if signals received by the controller 12 indicate a fault condition present in the circuit 10 as described herein.

Figure 2:
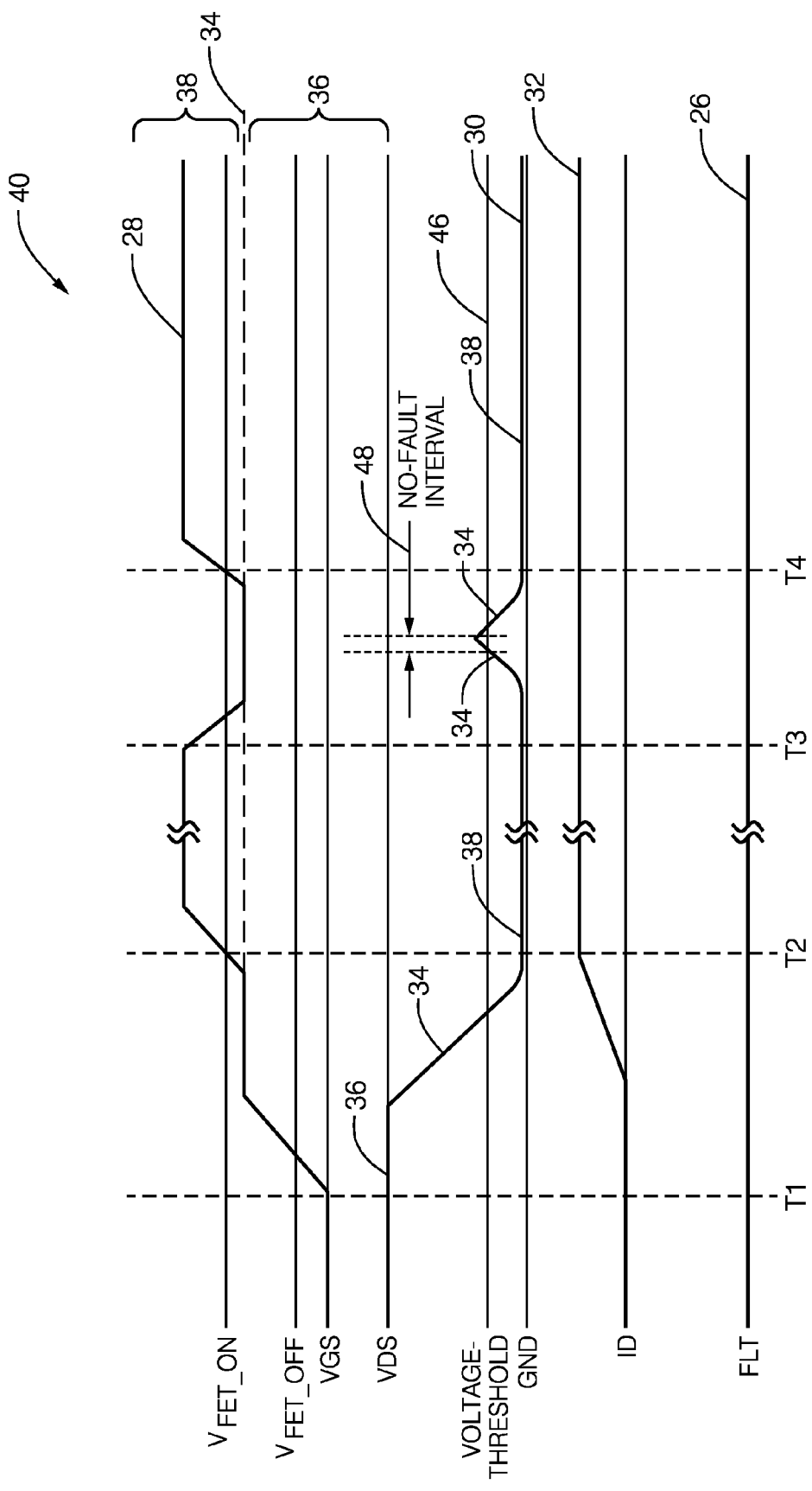
FIG. 2 is a graph of signals present in the circuit of FIG. 1 when no faults are detected in accordance with one embodiment.

FIG. 2 illustrates a non-limiting example of a graph 40 of signals present in the circuit 10 when there is no short-to-ground (STG) or open-circuit (OC) condition detected. The signals in the graph 40 include a gate-to-source voltage, hereafter the VGS 28; a drain-to-source voltage, hereafter the VDS 30; and the drain current, hereafter the ID 32, which can be used to determine the operational state of the switching-device 16. The graph 40 also illustrates the fault condition, hereafter the FLT 26 indicated, or output, by the controller 12. While FIG. 1 suggests that the FLT 26 is output by the controller 12, it is contemplated that fault condition corresponding to the FLT 26 may only be used within the controller 12 to determine or select a course of action by the controller 12, as will become apparent in the description that follows.

Figure 3:
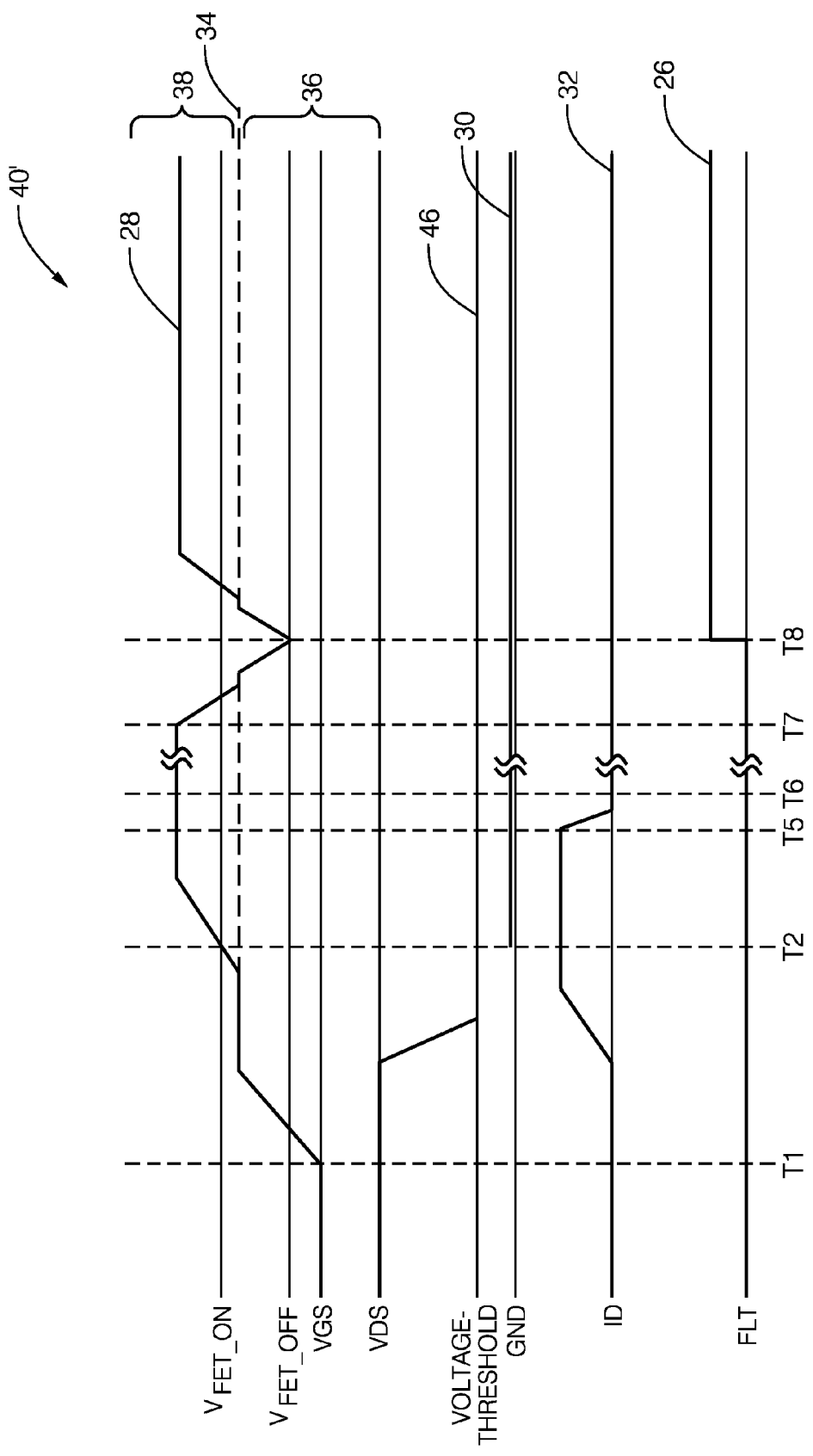
FIG. 3 is a graph of signals present in the circuit of FIG. 1 when faults are detected in accordance with one embodiment.

By way of example and not limitation, the following are typical times for the various time periods illustrated in FIGS. 2 and 3. Those in the art will recognize that the times generally depend on the magnitude of gate current applied to the switching-device 16. T1 to T2: 45 us—Turn on-time of the switching-device 16. T3 to T4: 15 us—Time from beginning of test when the gate voltage is reduced until the test has been completed for a no-fault condition and the load current has returned to normal. Time from the start of the test at T3 until the test is completed at the end of the no-fault interval 48 is typically around 10 us. T7 to T8: 20 us—Time from the command to run the OC or STG test until the gate voltage reaches its off-state threshold and an OC/STG fault can be flagged. A turn-off time for the switching-device 16 is typically the same as the turn-on time, but this is not a requirement.

Referring back to FIG. 1, the controller 12 includes a gate-driver 22 configured to control a gate-current 24 (IG) into or out of the switching-device 16. As will be recognized by those in the art, when the gate-current 24 flows in the direction illustrated, the VGS 28 will increase as illustrated in FIG. 2 between times T1 and T2, assuming that the VGS 28 was at or near ground (GND) prior to time T1 as illustrated. Those in the art will also recognize that the plateau region where the VGS 28 is horizontal between times T1 and T2 corresponds to when the switching-device 16 is operating in a linear-mode, hereafter the linear-state 34. Those in the art will also recognize that the switching-device 16 operates in the linear-state 34 while the switching-device 16 transitions between the off-state 36 and an on-state 38.

As will become apparent in the description that follows, it is preferable that the gate-current 24 is controlled such that the switching-device 16 is operated in the linear-state 34 for a sufficient period of time when the switching-device 16 transitions from an on-state 38 to an off-state 36 so that diagnostic testing of the circuit 10 can be performed. Such current control may be by way of a series resistor (not shown) within the gate-driver 22, or by equipping the gate-driver 22 with a controlled current source (also not shown) as will be recognized by those in the art.

The controller 12 also includes a voltage-detector 42 configured to determine a voltage-drop 44 across the switching-device 16. In this non-limiting example, the voltage-drop 44 is equal to the VDS 30, which is also shown in FIG. 2. It is contemplated that the switching-device 16 may be a type of device other than a MOSFET, an IGBT for example in which case the voltage-drop 44 would be the collector-to-emitter voltage (VCE).

The voltage-detector 42 may be equipped with a voltage comparator (not shown) with one input of the comparator connected to a voltage source configured to output a voltage-threshold 46 (FIG. 2), and the other input connected to the drain (D) of the switching-device 16 as illustrated in FIG. 1. By way of example and not limitation, a suitable value for the voltage-threshold 46 is one Volt (1V). However, it should be recognized that the value selected for the voltage-threshold 46 is selected based on the electrical characteristics of the electrical-load 14 and the switching-device 16. In order to determine if the circuit 10 is experiencing a short-to-ground (STG) condition or an open-circuit (OC) condition without deactivating the electrical-load 14 by operating the switching-device to the off-state 36, the switching-device 16 may be operated to the linear-state 34 so that a relatively small voltage is expected to appear across the switching-device 16. That is, as the switching-device 16 transitions out of the on-state 38 and into the linear-state 34, the voltage-drop 44 (i.e. VDS 30) is expected to increase as illustrated in FIG. 2 between times T3 and T4.

If the voltage-drop 44 is or becomes greater than the voltage-threshold 46, a signal output by the voltage-detector 42 to the processor 18 may start a timer (not shown) in the processor 18. If the is timer is configured to run as long as the voltage-drop 44, i.e. the VDS 30, remains greater than the voltage-threshold 46, and the timer runs for more than a predetermined time and during this time, a no-fault interval 48 of one-microsecond (1 us) in this example, then that is an indication that no STG or OC condition is present in the circuit 10. Using a timer to verify that the voltage-drop 44 persists at a value greater than the voltage-threshold 46 for a period of time is advantageous as transient noise is not likely to cause the controller 12 to inadvertently indicate a no-fault condition (FLT='0') when a STG or OC condition is actually present. In this example, the no-fault condition is indicated by the FLT 26 remaining unchanged during the test interval between time T3 and T4. As such, the controller 12 is configured to indicate a no-fault condition when the voltage-drop 44 is greater than a voltage-threshold 46 for more time than the no-fault interval 48 after the switching-device 16 is operated from the on-state 38 to the linear-state 34.

Preferably, the controller 12 is configured to operate the switching-device 16 to the on-state 38 after the no-fault condition is indicated. That is, as soon as the voltage-drop 44 is greater than the voltage-threshold 46 for the no-fault interval 48, the gate-driver 22 is operated to inject the gate-current 24 into the switching-device 16 and thereby return the switching-device 16 to the on-state 38. This is done to minimize any interference with the operation of the electrical-load 14 by minimizing the magnitude and duration that the VDS 30 is at some value other than the on-state 38. This also minimized the amount of self-heating that the switching-device may experience.

FIG. 3 illustrates a non-limiting example of a graph 40' of signals present in the circuit 10 when there is a short-to-ground (STG) or an open-circuit (OC) condition detected. Between times T1 and T2, the operation of the circuit 10 is similar to that shown in FIG. 2 over the same time. However, in this instance between times T5 and T6, a short-to-ground (STG) or an open-circuit (OC) condition occurs which causes the ID 32 to drop to near zero. That is, either a STG condition exists that shunts current around the switching-device 16, or an OC condition exists that prevents current from flowing through the electrical-load 14. Prior to time T7, that one or both of these conditions exists goes undetected. At time T7 the test performed by the circuit 10 begins, which is similar to when the test begins at time T3 in FIG. 2.

Beginning at time T7, the VGS is reduced and the switching-device 16 begins to transition from the on-state 38 into the linear-state 34. Since there is no current through the switching-device 16, i.e. the ID 32 is essentially zero; there is no increase in the VDS 30 as is the case in FIG. 2 between times T3 and T4. Because there is no instance of the VDS 30 increasing to a value greater than the voltage-threshold 46, the aforementioned timer in the processor 18 is not started, and the VGS continues to decrease until the VGS is at a value that corresponds to a value where the switching-device 16 is expected to be in or entering the off-state 36.

Since no increase of the voltage-drop 44 to a value greater than the voltage-threshold 46 is detected, it is presumed that a fault condition exists, i.e. a short-to-ground (STG) or an open-circuit (OC) condition exists. In response, the controller 12 raises the fault flag, i.e. the FLT is switched from low to high at time T8. As such, the controller 12 is configured to indicate a fault condition (FLT='1') when the voltage-drop 44 is not greater than the voltage-threshold 46 for more time than a no-fault interval 48 (FIG. 2) while the switching-device 16 is operated from the on-state 38 to the off-state 36.

Accordingly, a controller 12 configured to detect fault conditions in a circuit 10 that operates an electrical-load 14 is provided. The problem associated with open circuit detection which normally requires highly sensitive and/or expensive VDS sensing circuitry is solved by momentarily de-biasing the gate voltage of the switching-device 16. This is performed in a closed loop manner by manipulating the VGS 28 such that the electrical-load 14 is not de-energized in the process. Conventional implementations require expensive sense FETs or sense resistors and comparators. This expense and complexity is avoided in the proposed implementation by utilizing a digitally controlled sensing algorithm. High static power dissipation is avoided, as the effective on-resistance of the switching-device 16 is substantially maintained at a relatively low value while the test is executed. The STG/OC test may be initiated by a command input into the controller 12, or may be performed periodically by the controller 12 in an autonomous manner.

If during the test the VGS 28 voltage decreases to the $V_{FET\_OFF}$ threshold before the VDS 30 rises to the voltage-threshold 46, then the FLT 26 is set to indicate the presence of either an Open or Shorted-to-Ground load. Following the detection of the presence of an OC/STG the VGS may be returned to the on-state 38 such that if the OC/STG fault is removed, normal operation of the circuit 10 will resume. The test may be performed at a rate that satisfies the application requirements for OC/STG fault detection while in the on-state 38 of operation. It is possible to perform quickly enough so that near real time OC/STG fault detection can take place.

While this invention has been described in terms of the preferred embodiments thereof, it is not intended to be so limited, but rather only to the extent set forth in the claims that follow.

We claim:

1. A controller configured to detect fault conditions in a circuit that operates an electrical-load, said controller comprising:
    a gate-driver configured to control a gate-current to a switching-device, wherein the gate-current is controlled such that the switching-device is operated in a linear-state when the switching-device transitions from an on-state to an off-state;
    a voltage-detector configured to determine a voltage-drop across the switching-device, wherein the controller is configured to indicate a no-fault condition indicating that neither an open-circuit to the switching-device or a short-to-ground that bypasses the switching-device exists when the voltage-drop is greater than a voltage-threshold for more time than a no-fault interval after the switching device is operated from the on-state to the linear-state.

2. The controller in accordance with claim 1, wherein the controller is configured to operate the switching-device to the on-state after the no-fault condition is indicated.

3. The controller in accordance with claim 1, wherein the controller is configured to indicate a fault condition when the voltage-drop is not greater than the voltage-threshold for more time than a fault-interval while the switching device is operated from the on-state to the off-state.

\* \* \* \* \*